(12) United States Patent
Shipton et al.

(10) Patent No.: US 10,790,423 B2
(45) Date of Patent: Sep. 29, 2020

(54) LIGHT-EMITTING DIODE WITH LIGHT REDIRECTING STRUCTURE

(71) Applicant: Facebook Technologies, LLC, Menlo Park, CA (US)

(72) Inventors: Erik Shipton, Kenmore, WA (US); Tanya Malhotra, Redmond, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 16/144,575

(22) Filed: Sep. 27, 2018

(65) Prior Publication Data

US 2020/0006606 A1  Jan. 2, 2020

Related U.S. Application Data

(60) Provisional application No. 62/692,344, filed on Jun. 29, 2018.

(51) Int. Cl.
| | |
|---|---|
| *H01L 33/58* | (2010.01) |
| *H01L 27/15* | (2006.01) |
| *H01L 33/62* | (2010.01) |
| *H01L 33/00* | (2010.01) |
| *G02B 5/18* | (2006.01) |

(52) U.S. Cl.
CPC .............. *H01L 33/58* (2013.01); *G02B 5/18* (2013.01); *H01L 27/156* (2013.01); *H01L 33/0008* (2013.01); *H01L 33/62* (2013.01)

(58) Field of Classification Search
CPC ......... H01L 33/58; H01L 33/62; H01L 33/60; H01L 33/0008; H01L 27/156
See application file for complete search history.

(56) References Cited

U.S. PATENT DOCUMENTS

| | | | |
|---|---|---|---|
| 2006/0221633 A1 | 10/2006 | Yamauchi | |
| 2009/0267092 A1 | 10/2009 | Fukshima et al. | |
| 2017/0130935 A1* | 5/2017 | Hong | F21V 5/04 |
| 2017/0371090 A1* | 12/2017 | Fattal | H04N 13/302 |
| 2018/0187841 A1 | 7/2018 | Nakamura | |
| 2018/0245759 A1* | 8/2018 | Plank | F21S 41/663 |
| 2018/0277523 A1* | 9/2018 | Ahmed | H01L 25/0753 |
| 2018/0299607 A1* | 10/2018 | Menezes | G02B 6/0016 |
| 2019/0198576 A1* | 6/2019 | Schubert | H04N 13/32 |

* cited by examiner

*Primary Examiner* — Christine A Enad
(74) *Attorney, Agent, or Firm* — Matthew A. Pequignot; Evan J. Newman

(57) ABSTRACT

A light-emitting disclosure (LED) and an LED array are disclosed. The LED includes a semiconductor junction for emitting light and an optical surface coupled to the semiconductor junction for outputting at least a portion of the light. The optical surface can include a grating structure configured to increase the portion of the light outputted by the optical surface, and/or a redirecting structure configured to redirect the portion of the light to form an output optical beam.

18 Claims, 14 Drawing Sheets

LIGHT-EMITTING DIODE WITH LIGHT REDIRECTING STRUCTURE

REFERENCE TO A RELATED APPLICATION

The present application claims priority from U.S. Provisional Application No. 62/692,344 entitled "LIGHT-EMITTING DIODE WITH A LIGHT GUIDING STRUCTURE" filed on Jun. 29, 2018 and incorporated herein by reference in its entirety.

TECHNICAL FIELD

The present disclosure relates to optical components and modules, and in particular to light-emitting diodes and light-emitting diode arrays.

BACKGROUND

A light-emitting diode (LED) is a semiconductor light source having a semiconductor junction that emits light when a suitable current is applied to the semiconductor junction. When the current is applied, electrons are able to recombine with electron holes at a p-n junction of the LED, releasing energy in form of photons due to phenomenon known as electroluminescence.

While light generation efficiency of an LED's p-n junction has been steadily increasing since 1960s, the overall light generation efficiency of an LED has been limited due to challenges associated with extraction of generated light. Semiconductors tend to have a high index of refraction as compared to dielectrics, e.g. plastics or glass materials. Due to the high index of refraction, a significant portion of the light generated in the p-n junction tends to be totally internally reflected back inside the semiconductor. The reflection of light back into the semiconductor causes scattering and heat generation via absorption of the scattered light within the LED structure. One known approach to reducing deleterious effects of total internal reflection (TIR) of generated light is encapsulating the p-n junction with an index-matching material such as plastic or epoxy, to reduce the refractive index step, thereby increasing the TIR critical angle. The encapsulation also provides environmental protection to the p-n junction of the diode. Although less light undergoes TIR at the semiconductor-epoxy junction, TIR can still occur at the epoxy-air junction; as a result, a significant portion of the generated light never leaves the LED, causing heating and reducing the efficiency and the light yield of the LED.

BRIEF DESCRIPTION OF THE DRAWINGS

Exemplary embodiments will now be described in conjunction with the drawings, in which.

DETAILED DESCRIPTION

Figure 1A:
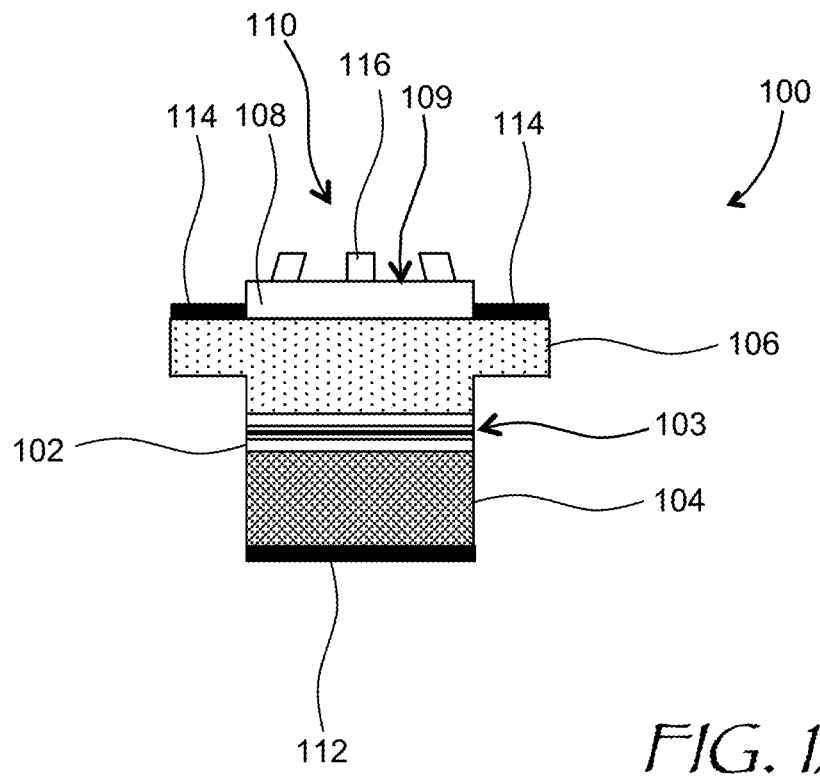
FIG. 1A is a side cross-sectional view of a light-emitting diode (LED) having a light-extracting grating structure in accordance with an embodiment of the present disclosure.

While the present teachings are described in conjunction with various embodiments and examples, it is not intended that the present teachings be limited to such embodiments. On the contrary, the present teachings encompass various alternatives and equivalents, as will be appreciated by those of skill in the art.

The present disclosure relates to improving extraction of light generated in the semiconductor junction of an LED, and a concurrent conditioning, e.g. redirecting and/or focusing, of the extracted light.

In accordance with the present disclosure, there is provided a light-emitting diode (LED) comprising a semiconductor junction for emitting light upon application of electric current, the semiconductor junction comprising positive (p) and negative (n) regions. An optical surface is coupled to the semiconductor junction and supported by one of the p- or n-regions for outputting at least a portion of the light emitted by the semiconductor junction, the optical surface comprising a grating structure configured to increase the portion of the light outputted by the optical surface.

A substrate may be supporting the semiconductor junction, the optical surface being a top surface of the one of the p- or n-regions. In some embodiments, a dielectric layer may be provided on top of the one of the p- or n-regions, the optical surface being a top surface of the dielectric layer. The dielectric layer may include a plurality of dielectric nanoantennas. A structured metamaterial layer may also be provided on top of the one of the p- or n-regions, the optical surface being a top surface of the structured metamaterial layer.

In some embodiments, the grating structure includes at least one of: an array of features extending from the optical surface; or an array of voids extending into the optical surface. The array of features or voids may include at least one of: rectangular features or voids; annular features or voids; cross-shaped features or voids; or chevron-shaped features or voids, respectively. The array of features or voids may include slanted features or voids extending at an acute angle relative to the optical surface, for example, inclined towards a center of the optical surface. In some embodiments, a number of features in the array is between 4 and 16 features, and/or a number of voids in the array is between 4 and 16 voids. The grating structures may be rather small, e.g. not exceed 6 microns by 6 microns.

In accordance with the present disclosure, there is provided an LED array comprising a substrate and an array of semiconductor junctions supported by the substrate and configured to emit light upon application of electric current. An optical surface is coupled to at least one of the array of semiconductor junctions for outputting at least a portion of the light emitted thereby. The optical surface may include a grating structure configured to increase the portion of the light outputted by the optical surface. The semiconductor junctions of the array may each comprise positive (p) and negative (n) regions, where the optical surface is supported by one of the p- or n-regions.

In some embodiments, the optical surface comprises a top surface of the one of the p- or n-regions. In some embodiments, the LED array further includes a plurality of layers on top of the one of the p- or n-regions, where the optical surface comprises a top surface of the plurality of layers. In some embodiments, the grating structure may include at least one of: an array of features extending from the optical surface; or an array of voids extending into the optical surface. The array of features or voids may include slanted features or voids, respectively, extending at an acute angle relative to the optical surface. The features or voids may be oriented to provide a pre-defined divergence of the portion of the light outputted by the optical surface.

In some embodiments, the LED array includes a plurality of optical surfaces. Each optical surface of the plurality of optical surfaces may be coupled to one of the array of semiconductor junctions for outputting at least a portion of the light emitted thereby. Each optical surface of the plurality of optical surfaces may include a grating structure configured to increase the portion of the light outputted thereby. The slanted features or voids of each optical surface of the plurality of optical surfaces may be inclined towards a center of the LED array. The optical surface may be coupled to each semiconductor junction of the array.

In accordance with the present disclosure, there is further provided a method of manufacturing an LED. The method includes providing a semiconductor junction for emitting light, providing an optical surface for outputting at least a portion of the light, where the optical surface is coupled to the semiconductor junction, and forming, in the optical surface or on the optical surface, a grating structure configured to increase the portion of the light outputted by the optical surface. The forming may be performed using nanoimprint lithography.

In accordance with the present disclosure, there is further provided an LED comprising a semiconductor junction for emitting light upon application of electric current, the semiconductor junction comprising positive (p) and negative (n) regions. An optical surface is coupled to the semiconductor junction and supported by one of the p- or n-regions for outputting at least a portion of the light emitted by the semiconductor junction. The optical surface may include a redirecting structure configured to redirect a chief ray of the portion of the light outputted by the optical surface from an initial direction to a pre-determined different direction. The optical surface may be a top surface of the one of the p- or n-regions. A dielectric layer may be provided on top of the one of the p- or n-regions, such that the optical surface is a top surface of the dielectric layer.

In some embodiments, the redirecting structure comprises at least one of: a grating structure, a prism, an off-center microlens, or a layer comprising a refractive index gradient. The redirecting structure may include a layer having a plurality of openings in the layer, the openings having a laterally varying density for providing the refractive index gradient. The grating structure may include a metamaterial grating structure. In some embodiments, the grating structure includes at least one of: an array of features extending from the optical surface; or an array of voids extending into the optical surface.

In some embodiments, the array of features or voids include at least one of: rectangular features or voids; annular features or voids; cross-shaped features or voids; or chevron-shaped features or voids, respectively. The array of features may also include slanted features or voids, respectively, extending at an acute angle relative to the optical surface. In some embodiments, size of the redirecting structure is no greater than 6 microns by 6 microns.

In accordance with the present disclosure, there is further provided an LED array including a substrate, an array of semiconductor junctions supported by the substrate and configured to emit light upon application of electric current, and an optical surface coupled to at least one of the array of semiconductor junctions for outputting at least a portion of the light emitted thereby. The optical surface may include a redirecting structure configured to redirect a chief ray of the portion of the light outputted by the optical surface from am initial direction to a pre-determined different direction. The semiconductor junctions may each include positive (p) and negative (n) regions, such that the optical surface is supported by one of the p- or n-regions of a corresponding semiconductor junction.

In some embodiments, the optical surface is a top surface of the one of the p- or n-regions. A dielectric layer may be disposed on top of the one of the p- or n-regions, the optical surface being a top surface of the dielectric layer. The redirecting structure may be configured to redirect the chief ray of the portion of the light towards a center of the LED array. In some embodiments, the redirecting structure is configured to provide a pre-defined divergence of the portion of the light outputted by the optical surface. The redirecting structure may include e.g. at least one of: a grating structure, a prism, an off-center microlens, a layer comprising a refractive index gradient, or a layer having a plurality of openings therein, the openings having a laterally varying density. The grating structure may include e.g. at least one of: an array of features extending from the optical surface; or an array of voids extending into the optical surface. The array of features or voids may include slanted features or voids, respectively, extending at an acute angle relative to the optical surface. The slanted features or voids may be inclined towards a center of the LED array.

In accordance with the present disclosure, there is further provided a method of manufacturing an LED. The method includes providing a semiconductor junction for emitting light, the semiconductor junction comprising positive (p) and negative (n) regions, providing an optical surface supported by one of the p- or n-regions for outputting at least a portion of the light, wherein the optical surface is coupled to the semiconductor junction, and forming, in the optical surface or on the optical surface, a redirecting structure configured to redirect a chief ray of the portion of the light outputted by the optical surface from an initial direction to a pre-determined different direction.

Figure 1B:
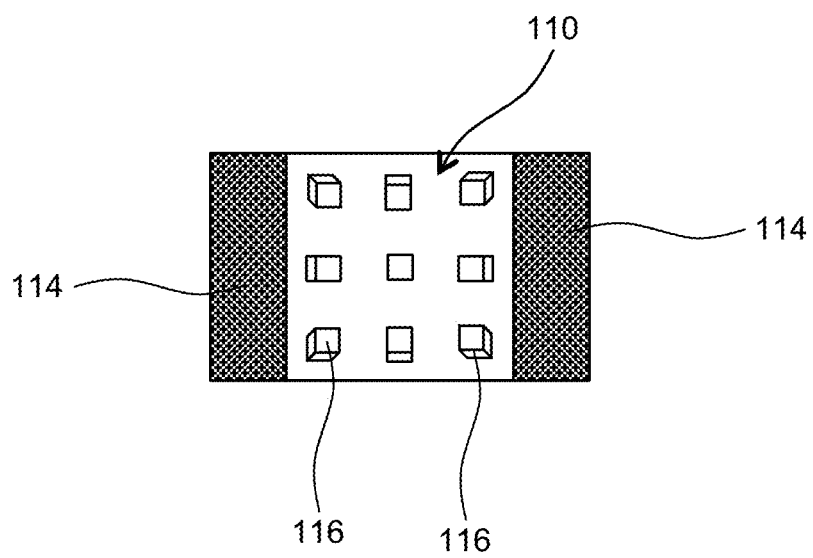
FIG. 1B is a plan view of the LED of FIG. 1A.

Referring now to FIGS. 1A and 1B, an LED 100 includes a semiconductor junction 102 formed at a boundary of n-type 104 and p-type 106 semiconductor regions. A dielectric layer 108 may be disposed on the p-region 106. An optical surface 109 of the dielectric layer 108 is optically coupled to the semiconductor junction 102 for outputting at least a portion of light emitted by the semiconductor junction 102 upon application of electric current. The optical surface 109 includes a grating structure 110 configured to increase the portion of light outputted by the optical surface 109. The semiconductor junction 102 may include quantum wells 103. Electrodes 112 and 114 may be provided for supplying the electric current to the n-type 104 and p-type 106 semiconductor regions. The electrode configuration is only shown by way of a non-limiting example. Other configurations are possible. For example, in an inverted configuration, the dielectric layer 108 may be disposed on the n-region 104 disposed above the p-region 106, and the dielectric layer 108 may be supported by the n-region 104, such that the light emission occurs on the side of the n-type semiconductor region 104. In some embodiments, a plurality of layers, e.g. a structured metamaterial layer or layers, can be provided in place of the single dielectric layer 108. The lower region of the semiconductor junction 102 can be supported by a substrate. In this disclosure, the term "substrate" includes both a carrier substrate, that is, a substrate of a manufactured array, and a growth substrate used to manufacture individual semiconductor junctions 102.

Figure 2A:
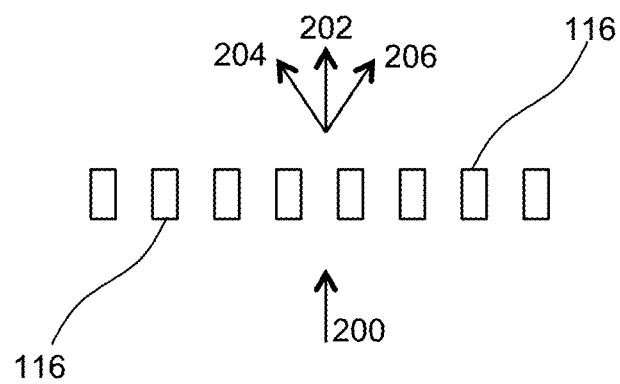
FIG. 2A is a side schematic view of a diffraction grating having straight grooves.
Figure 2B:
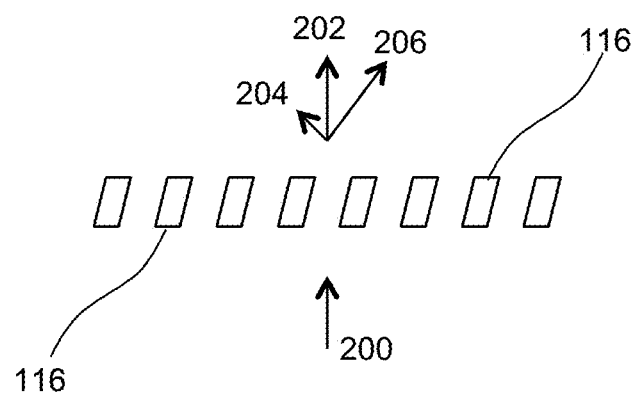
FIG. 2B is a side schematic view of a diffraction grating having slanted grooves.

In the embodiment shown in FIGS. 1A and 1B, the grating structure 110 of the LED 100 includes an array of features 116 extending from the optical surface 109 of the dielectric layer 108. The features 116 may be slanted towards a center of the grating structure 110, as shown in FIGS. 1A and 1B. The operation of the slanted features 116 will be illustrated by first considering a diffraction grating of FIG. 2A, which has straight, i.e. not slanted, features 116. Incoming light 200 (FIG. 2A) is diffracted in three diffraction orders, $0^{th}$ order 202, $-1^{st}$ order 204, and $+1^{st}$ order 206. In FIG. 2B, the features 116 are slanted, resulting in more light energy going in the direction of the $+1^{st}$ order 206. Thus, the grating structure 110 with slanted features 116 enables guiding or steering of diffracted light energy in a desired direction. The actual direction of light propagation depends both on the grating pitch and the slant angle of the features 116.

Figure 3:
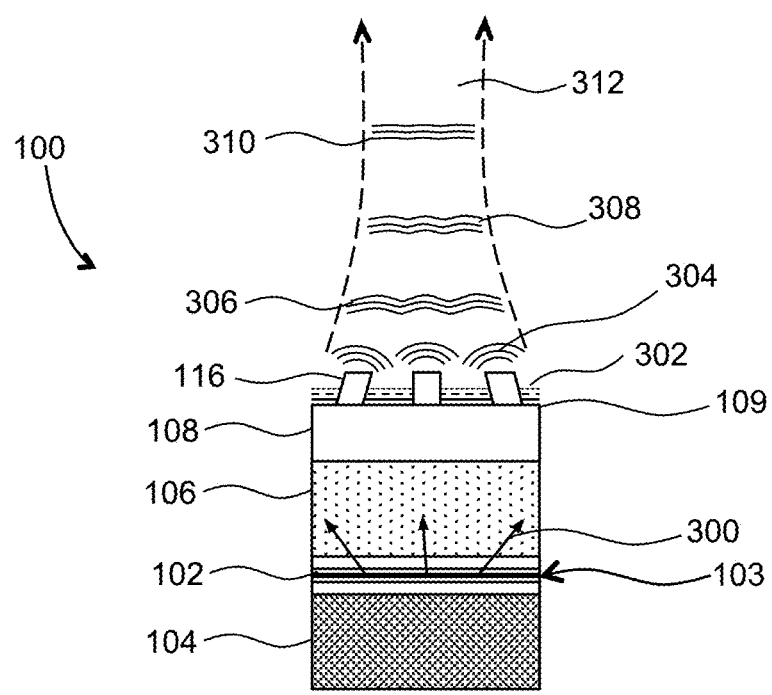
FIG. 3 is a side cross-sectional view of the LED of FIGS. 1A and 1B illustrating a light-extracting property of the LED grating.

The light extracting and directing property of the grating structure 110 with slanted features 116 is further illustrated in FIG. 3. Light 300 emitted by the semiconductor junction 102 of the LED 100, e.g. from the quantum wells 103 when present at the semiconductor junction 102, reaches the optical surface 109. A portion of the light 300 is totally internally reflected by the optical surface 109. The total internal reflection causes evanescent waves 302 to appear outside of the dielectric layer 108 very close to the optical surface 109. These evanescent waves 302 are gathered and re-emitted by the features 116, as shown at 304, creating a common non-evanescent wave having a wavefront 306, which propagates further as shown at 308 and 310. The propagating wave obtains energy from the evanescent waves 302. The slant of the features 116 enables the propagating wave to form an optical beam 312, which can be focused at a certain distance away from the optical surface 109, as shown at 310. Effectively, the features 116 "throw forward" the waist of the optical beam 312 thus providing a pre-defined, controllable divergence of the portion of the light outputted by the optical surface 109. It is noted that in FIG. 3, an electrode structure of the LED 100 is omitted for brevity. It is to be understood that the number of the features 116 in the grating structure 110 may differ from the number of features 116 shown herein. As a non-limiting example, for small grating structures 110 and small semiconductor junctions 102 measuring no greater than 6 microns by 6 microns, between 4 and 16 features may be provided.

Other shapes and patterns of a grating structure may be employed for extracting and/or redirecting light from a semiconductor junction of an LED. For instance, referring to FIGS. 4A and 4B, an LED 400 is similar to the LED 100 of FIGS. 1A, 1B, and FIG. 3. The LED 400 includes a grating structure 410 extending from a surface 409 of a dielectric layer 408, which is disposed on the p-type region 106. The grating structure 410 includes an array of concentric annular features 416, which can extract and guide/focus light in a similar manner as the array of features 116 of the grating structure 110 of FIGS. 1A, 1B, and FIG. 3. In the embodiment shown in FIGS. 4A and 4B, the array includes a cylindrical central feature 416A surrounded by concentric annular features 416, which may be slanted inwards as shown. The array of features 416, 416A may be optimized using optical simulation software to increase the portion of energy extracted from evanescent waves, to guide the extracted light for providing a focus above the LED 400, and also to guide the portion of light which exits the LED 400 without TIR. The array of features 416, 416A is symmetrical w.r.t. an axis 450. In some embodiments, the entire array of features 416, 416A may be slanted off-axis, to direct the extracted light beam in a pre-determined direction forming a non-zero angle with the axis 450. In other words, a chief ray of the extracted light portion outputted by the surface 409 may be redirected from an initial direction, i.e. parallel to the axis 450, to a pre-determined different direction, i.e. an off-axis direction.

Figure 4A:
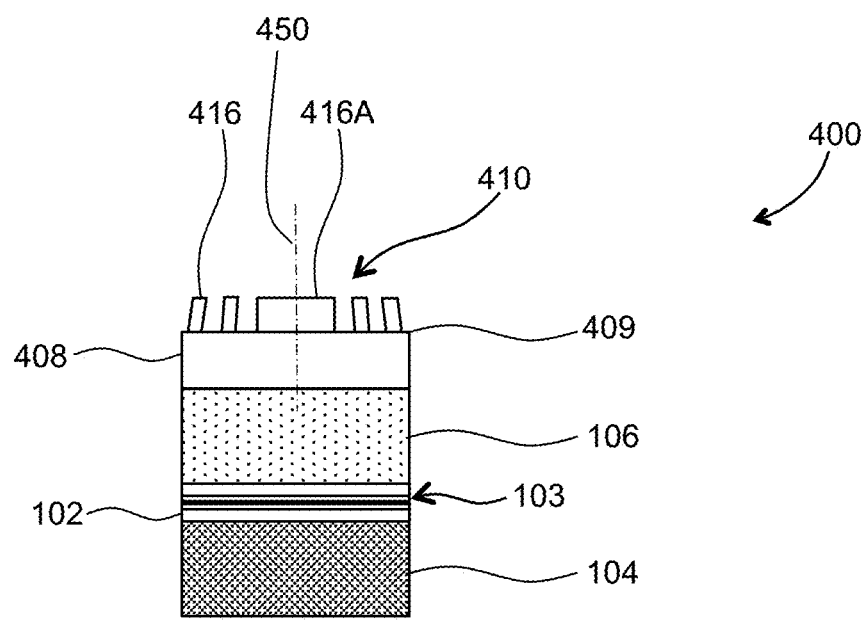
FIG. 4A is a side cross-sectional view of an LED having a light-extracting annular grating structure.
Figure 4B:
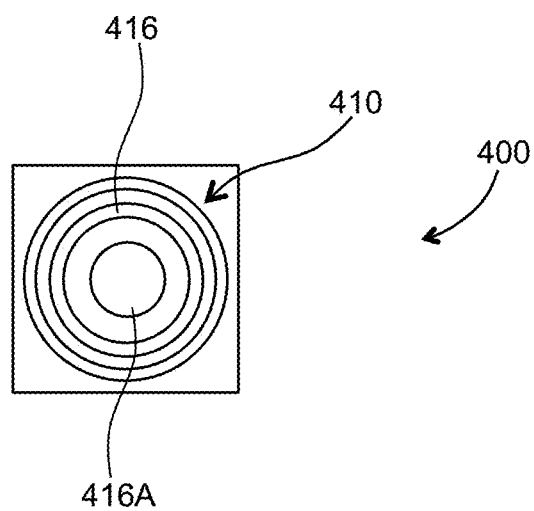
FIG. 4B is a plan view of the LED of FIG. 4A.
Figure 5A:
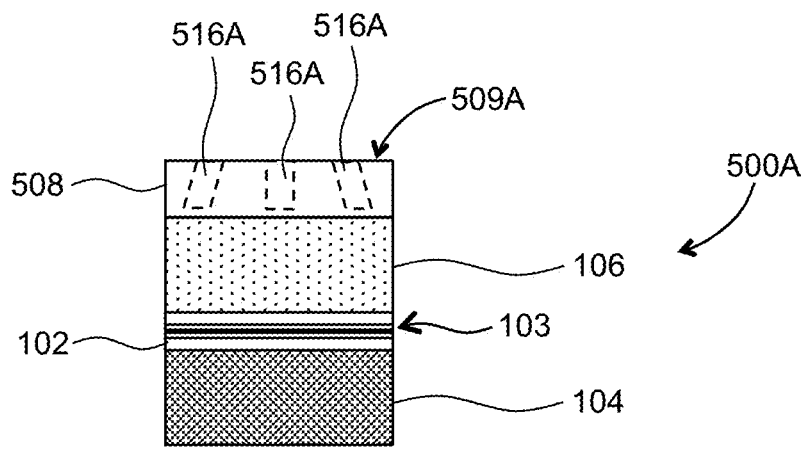
FIG. 5A is a side cross-sectional view of an LED having an array of voids extending into a dielectric layer on top of the semiconductor diode structure.

Referring to FIG. 5A, an LED 500A includes the semiconductor junction 102 formed by joining the n-type 104 and p-type 106 semiconductor regions, as in the LED 100 of FIGS. 1A and 1B, the LED 300 of FIG. 3, and the LED 400 of FIGS. 4A and 4B. In the LED 500A of FIG. 5A, an array of voids 516A extends into an optical surface 509A of a dielectric layer 508. The voids 516A may be disposed symmetrically w.r.t the center of the array. The voids 516A may be slanted symmetrically, as shown in FIG. 5A, or straight. The voids 516A may also be slanted asymmetrically, to direct extracted light energy off-axis, if so desired. The voids 516A may have e.g. a rectangular, circular, oval, or polygonal cross-section. The configuration of the array of voids 516A may be optimized using optical simulation software to increase the portion of energy extracted from evanescent waves, to guide the extracted light for providing a focus above the LED 500A, and/or to guide the portion of light which exits the LED 500A without TIR. For small semiconductor junctions 102 measuring no greater than 6 microns by 6 microns, between 4 and 16 voids 516A may be provided.

Figure 5B:
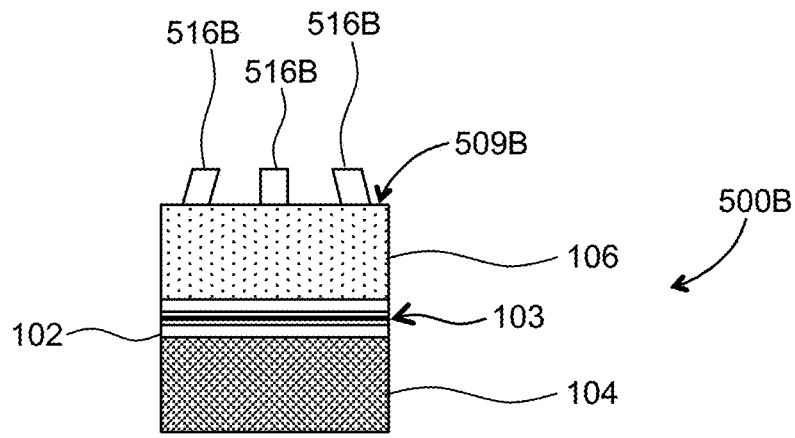
FIG. 5B is a side cross-sectional view of an LED having an array of features extending directly from the semiconductor diode structure.

Turning to FIG. 5B, an LED 500B is similar to the LED 100 of FIG. 1A. The LED 500B of FIG. 5B also includes the semiconductor junction 102 formed by joining the n-type 104 and p-type 106 semiconductor regions. In the LED 500B of FIG. 5B, an array of features 516B extends directly from the semiconductor junction, i.e. from a top surface 509B of the p-region 106 of an LED 500B. The features 516B may be slanted symmetrically, as shown in FIG. 5B, or straight. The features 516B may also be slanted asymmetrically, to direct extracted light energy off-axis, if so desired. The features 516B may have e.g. a rectangular, circular, oval, or polygonal cross-section. The configuration of the array of features 516B may be optimized using optical simulation software to increase the portion of energy extracted from evanescent waves, to guide the extracted light for providing a focus above the LED 500B, and/or to guide the portion of light which exits the LED 500B without TIR.

Figure 5C:
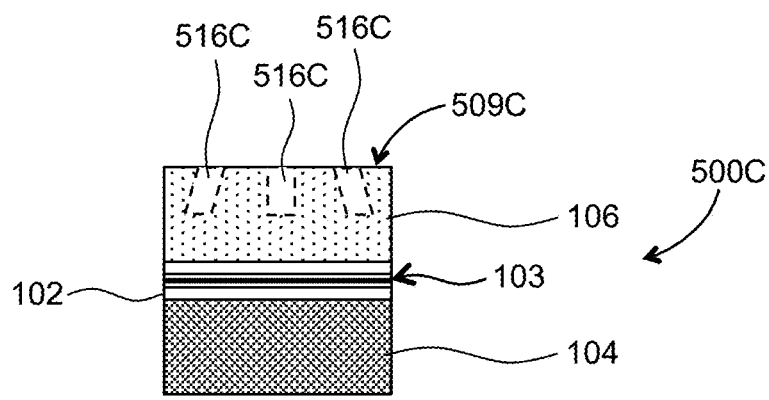
FIG. 5C is a side cross-sectional view of an LED having an array of voids extending into the semiconductor diode structure.

A embodiment of an LED 500C of FIG. 5C is similar to the LED 500A of FIG. 5A, the difference being that an array of rectangular voids 516C extends directly into a top surface 509C of the p-region 106. The top surface 509C of the p-region 106 of the semiconductor junction 102 corresponds to the optical surface 109 of the dielectric layer 108 of the LED 500A of FIG. 5A. The voids are not limited to rectangular shapes and can be annular shaped, for example, similarly to the LED 400 of FIGS. 4A and 4B, elliptical, polygon, chevron-shaped, etc.

Figure 6A:
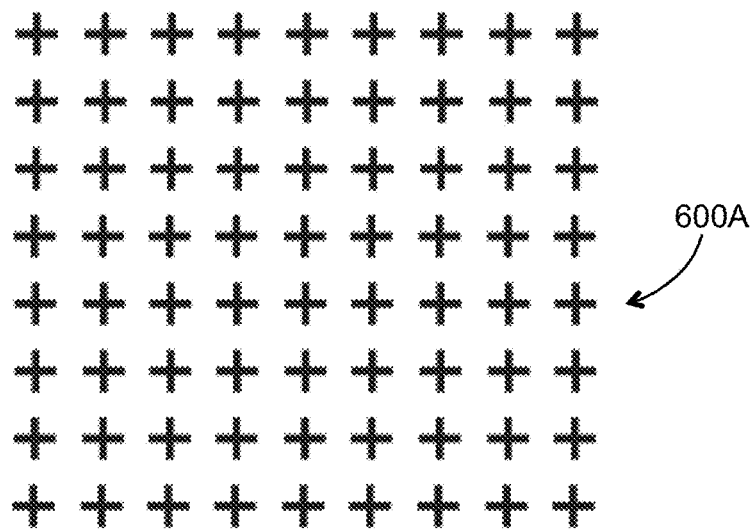
FIG. 6A is a top view of a light-extracting grating structure of the present disclosure including an array of cross-shaped features.
Figure 6B:
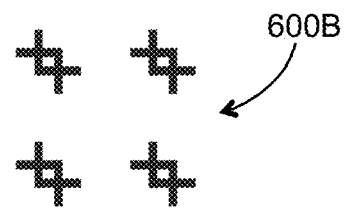
FIG. 6B is a top view of a light-extracting grating structure of the present disclosure including an array of superimposed chevron-shaped features.

The features 516B or voids 516A, 516C of FIGS. 5A to 5C may have other shapes, as well. By way of non-limiting examples, referring to FIG. 6A, an array of cross-shaped features or voids 600A can be used for extracting light from a semiconductor junction of an LED. The features or voids can also be chevron-shaped. The chevrons may be separate from one another or superimposed to form more complex structures as shown at 600B in FIG. 6B.

Figure 7A:
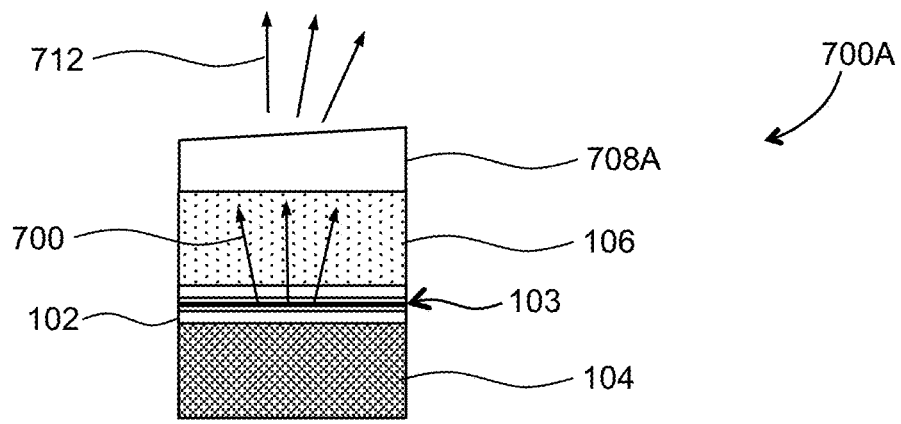
FIG. 7A is a side cross-sectional view of an LED having a beam-redirecting prism on top of the semiconductor diode structure.

Referring to FIG. 7A, an LED 700A includes the semiconductor junction 102 formed by joining the n-type 104 and p-type 106 semiconductor regions, similar to the LED 100 of FIGS. 1A and 1B, and similar to other LED embodiments considered above. The LED 700A of FIG. 7A includes a prismatic structure 708A in place of the dielectric layer 108. The purpose of the prismatic structure 708A is to redirect a portion 712 of light 700 emitted by the semiconductor junction 102. A tilted top optical surface of the prismatic structure 708A changes a direction of the flow of light energy emitted by the semiconductor junction 102. By selecting the orientation, i.e. clocking angle, or rotation angle about an optical axis, and the prism angle of the prismatic structure 708A, one can define the direction in which most of the emitted light energy propagates, or where a chief ray of the portion 712 of light propagates, within a range of directions defined relative to some reference surface or edge, e.g. relative to a front edge of a carrier substrate or a growth substrate of the LED 700A, or relative to an optical axis of the LED 700A. This enables so-called chief ray engineering of an array of such LEDs, providing a more efficient light gathering and utilization by an optical system powered by the LED array. The prismatic structure may include a rectangular prism, a round prism, i.e. a truncated cylinder, or any other structure having a tilted refracting upper surface for steering the light portion 712. An off-center microlens, not shown, may be used in place of the prismatic structure 708A, with a similar result. Furthermore, the top surface of the p-region 106, or n-region 104 for inverted geometries, may also be slanted to achieve chief ray redirecting function. The top surface of the semiconductor or oxide layers may include any of the redirecting structures described herein.

Figure 7B:
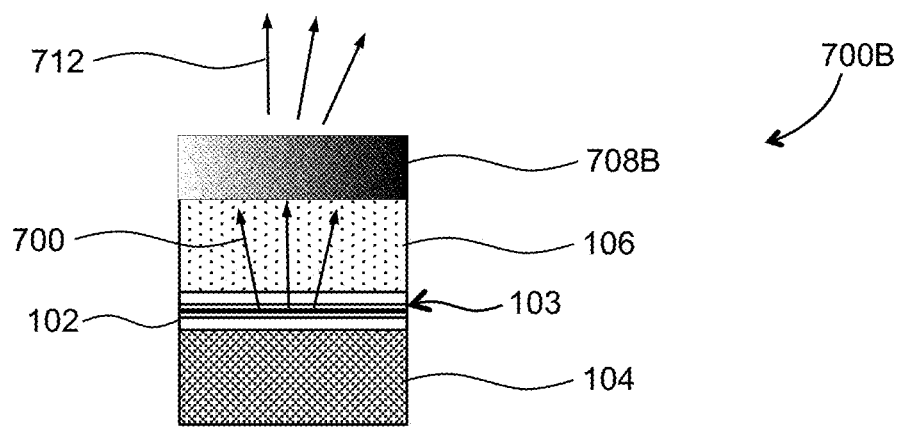
FIG. 7B is a side cross-sectional view of an LED having a beam-redirecting graded index layer on top of the semiconductor diode structure.

Other types of redirecting structures may be used. Referring to FIG. 7B, an LED 700B includes a lateral refractive index gradient layer 708B, which performs a same or similar beam redirecting function as the prismatic structure 708A of FIG. 7A. The lateral refractive index gradient layer 708B has an index of refraction varying laterally, e.g. from left to right as shown in FIG. 7B, providing a same or similar light steering effect of redirecting the portion 712 of the light 700 emitted by the semiconductor junction 102. The lateral refractive index gradient layer 708B may include a similar material as a gradient-index lens.

Figure 7C:
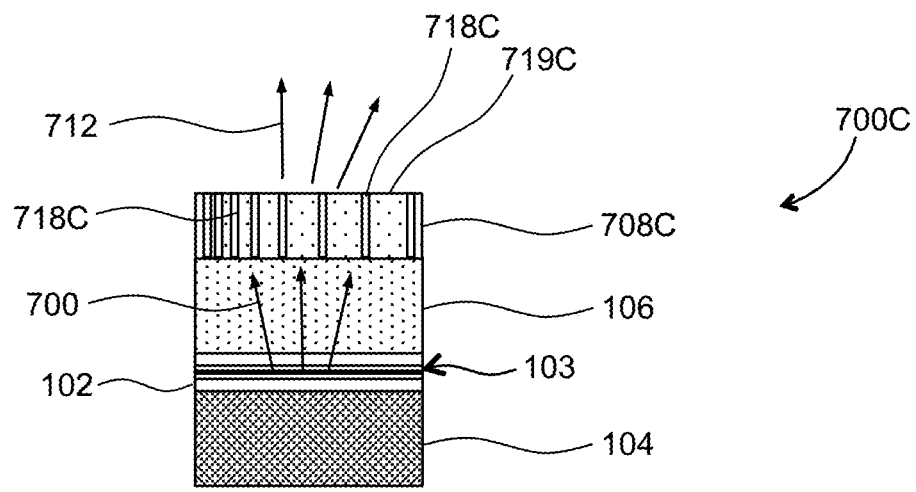
FIG. 7C is a side cross-sectional view of an LED having a beam-redirecting porous layer on top of the semiconductor diode structure.

An LED 700C of FIG. 7C is similar to the LED 700B of FIG. 7B. In the LED 700C of FIG. 7C, a layer 708C has a plurality of sub-micrometer openings 718C. The sub-micrometer openings 718C have a laterally varying density in the layer 708C, for providing the laterally varying effective refractive index, i.e. the effective refractive index gradient. The beam redirecting function of the layer 708C is thus similar to that of the gradient layer 708B. The light portion 712 can be steered in a desired direction at an acute angle with a normal to an upper surface 719C of the layer 708C. It is further noted that the portion 712 of the light 700 may not only be steered, but also focused or defocused by selecting a corresponding variation of the sub-micrometer openings 718C, e.g. a non-linear variation described e.g. by a quadratic, cubic, or a polynomial dependence on the lateral coordinate. The focusing or defocusing can be anamorphic, i.e. different in x- and y-planes, if required. Thus, a pre-defined divergence of the outputted portion of light can be provided.

Figure 7D:
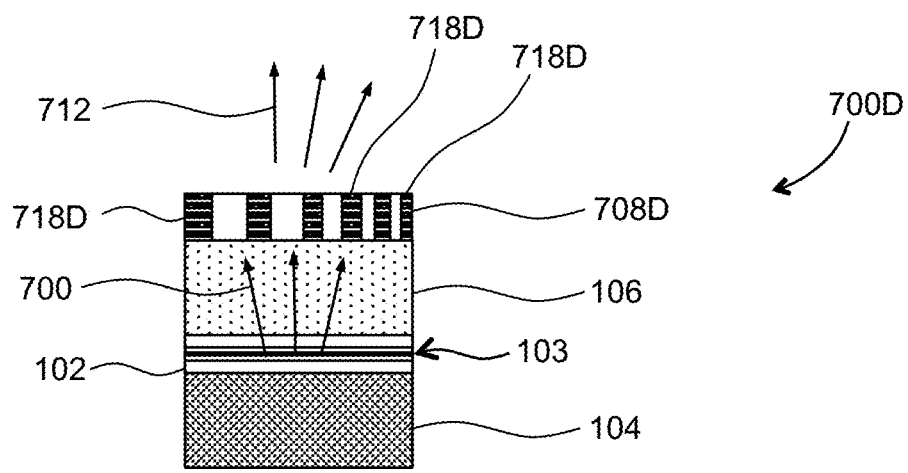
FIG. 7D is a side cross-sectional view of an LED having a beam-redirecting structured metamaterial layer on top of the semiconductor diode structure.

An LED 700D of FIG. 7D is similar to the LED 700B of FIG. 7B. In the LED 700D of FIG. 7D, a layer 708D has a metamaterial grating including plurality of grooves 718D. Each groove 718D comprises a stack of interposed thin metal and dielectric, or metal and semiconductor layers, or metal, dielectric, and semiconductor layers. The materials and thicknesses of the layers are selected such as to engineer a desired dielectric permittivity for a component of the portion 712 of the light 700 polarized perpendicular to the grooves 718D. The grooves 718D have a laterally varying density in the layer 708D, for providing the laterally varying effective refractive index, i.e. the effective refractive index gradient. The metamaterial grating can include interposed layers of metal such as gold or silver and dielectric such as metal or semiconductor oxide, semiconductor such as silicon and dielectric, metal and semiconductor, etc. In some embodiments, the metamaterial layer includes a plurality of dielectric nanoantennas. As in case of the LED 700C of FIG. 7C, the light portion 712 may not only be steered i.e. its chief ray redirected, but the light portion 712 may also be focused or defocused by selecting a corresponding variation of the groove 718D, e.g. a non-linear variation described e.g. by a quadratic, cubic, or a polynomial dependence on the lateral coordinate. The focusing or defocusing can also be anamorphic, that is, different in x- and y-planes. Thus, a pre-defined divergence of the outputted portion of light can be provided.

Figure 8A:
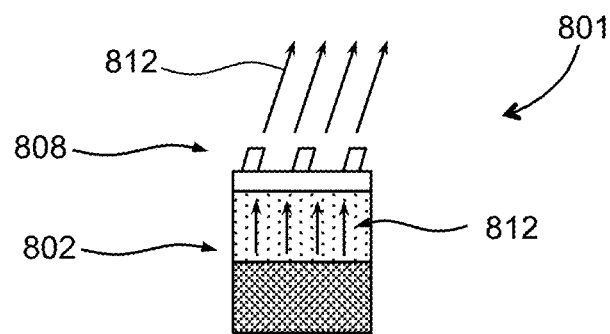
FIG. 8A is a side cross-sectional view of an LED with a redirecting grating structure for steering an output beam in a pre-defined direction.
Figure 8B:
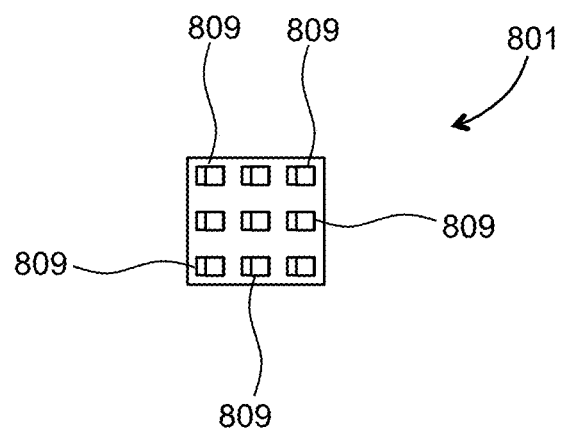
FIG. 8B is a top view of the LED of FIG. 8A.
Figure 8C:
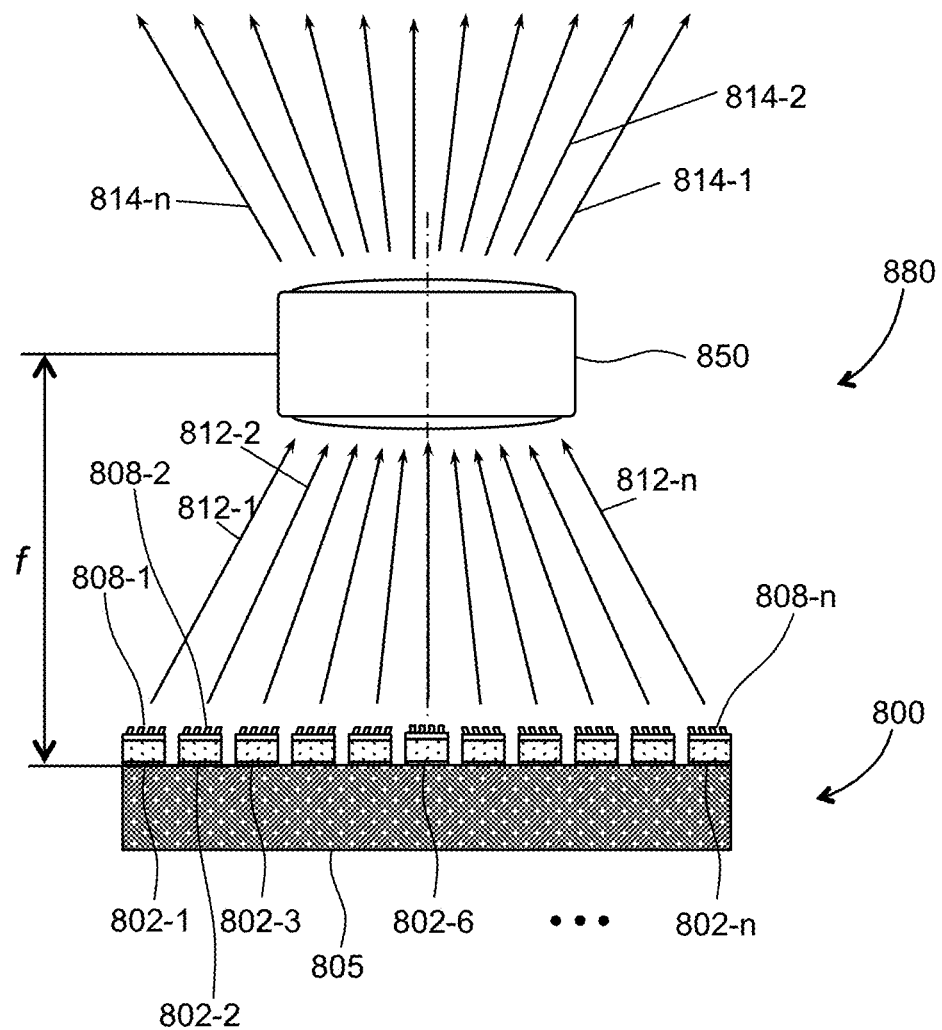
FIG. 8C is a side cross-sectional view of an image projector including an LED array with chief ray engineering.

The principle of LED chief ray engineering is further illustrated in FIGS. 8A to 8C. Referring first to FIGS. 8A and 8B, an LED 801 has a semiconductor junction, i.e. a p-n junction 802, and a beam-steering grating 808 optically coupled to the p-n junction 802 for steering rays 812 in one direction as shown. In the embodiment shown, the beam-steering grating 808 includes an array of slanted features 809 having a rectangular cross-section, although other cross-section shapes, e.g. polygonal, oval, circular, chevron, etc., may be used. The features 809 are slanted or inclined in a desired direction of steering of the rays 812. Any redirecting structure described herein, such as the prism, a layer comprising a refractive index gradient, a layer having a plurality of openings or voids, a metamaterial grating, etc., may be used for this purpose. It is further to be understood that the rays 812 are shown parallel for the sake of simplicity. In an actual device, the rays 812 may also form a converging or diverging optical beam, having a chief ray directed and oriented as required. In other words, the LED chief ray engineering enables not only steering a chief ray of LED emission, but also allows one to focus or reshape emitted optical beam.

Turning now to FIG. 8C, an image projector 880 comprises an LED array 800 optically coupled to a projection objective lens 850. The LED array 800 includes an array of n semiconductor junctions 802-1, 802-2, . . . , 802-n, supported by a common carrier substrate 805, which can be, for example, a common n-type substrate for the semiconductor junctions 802-1, 802-2, . . . , 802-n formed by respective structured p-layers, or vice versa. The semiconductor junctions 802-1, 802-2, . . . , 802-n may form a one-dimensional or a two-dimensional array. An electrode structure and/or a controlling gate structure in a multiplexed drive configuration may be provided for independently energizing each semiconductor junction 802-1, 802-2, . . . , 802-n of the LED array 800. The electrode/gate structure is not shown in FIG. 8C for simplicity.

Optical surfaces 808-1, 808-2, . . . , 808-n may be coupled to the respective semiconductor junctions 802-1, 802-2, . . . , 802-n, and may be disposed opposite the common carrier substrate 805 as shown. The optical surfaces 802-1, 802-2, . . . , 802-n may include any of the grating structures or beam redirecting structures described herein, for facilitating the light extraction from the corresponding semiconductor junctions 802-1, 802-2, . . . , 802-n, and for redirecting respective beams 812-1, 812-2, . . . , 812-n as required. By way of a non-limiting example, the optical surfaces 808-1, 808-2, . . . , 808-n may include grating structures having slanted or inclined features, and/or redirecting features such as the prismatic structure 708A (FIG. 7A), a refractive index gradient layer 708B (FIG. 7B), a layer 708C with sub-micrometer openings 718C (FIG. 7C), or a metamaterial grating layer 708D (FIG. 7D). The features may be inclined towards the center of the LED array 800, redirecting the beams 812-1, 812-2, . . . , 812-n towards a clear aperture of the projection objective lens 850, which operates to project an image formed by the light-emitting semiconductor junctions 802-1, 802-2, . . . , 802-n of the LED array 800. In some embodiments, a single optical surface may be coupled to each semiconductor junction 802-1, 802-2, . . . , 802-n of the array. The projection objective lens 850 may be disposed one focal length away from the LED array 800 to collimate individual beams 812-1, 812-2, . . . , 812-n to produce corresponding collimated output beams 814-1, 814-2, . . . , 814-n, while transforming a linear coordinate of each semiconductor junction 802-1, 802-2, . . . , 802-n into a beam angle of the corresponding output beam 814-1, 814-2, . . . , 814-n, so as to form an image in angular domain, which can be used, for example, in a near-eye display. The individual beams 812-1, 812-2, . . . , 812-n may also be refocused or reshaped for a better matching to the clear aperture of a projection objective lens 850. The engineered rays enable one to drastically reduce the required aperture of the projection objective 850, increasing throughput and saving space, weight, and manufacturing costs. The LED array disclosed herein may include an active-matrix organic light-emitting diode (AMOLED) array or a transparent organic light emitting diode (TOLED) array, for example. Grating structures 110 of FIGS. 1A and 1B, 410 of FIGS. 4A and 4B, 516A, 516B, 516C of FIGS. 5A, 5B, and 5C respectively, 600A and 600B of FIGS. 6A and 6B respectively, 718C and 718D of FIGS. 7C and 7D respectively, and their variants or combinations may be used to facilitate extracting light in an organic light emitting display (OLED), an inorganic light emitting display (ILED), AMOLED, TOLED, or a combination thereof.

Figure 9:
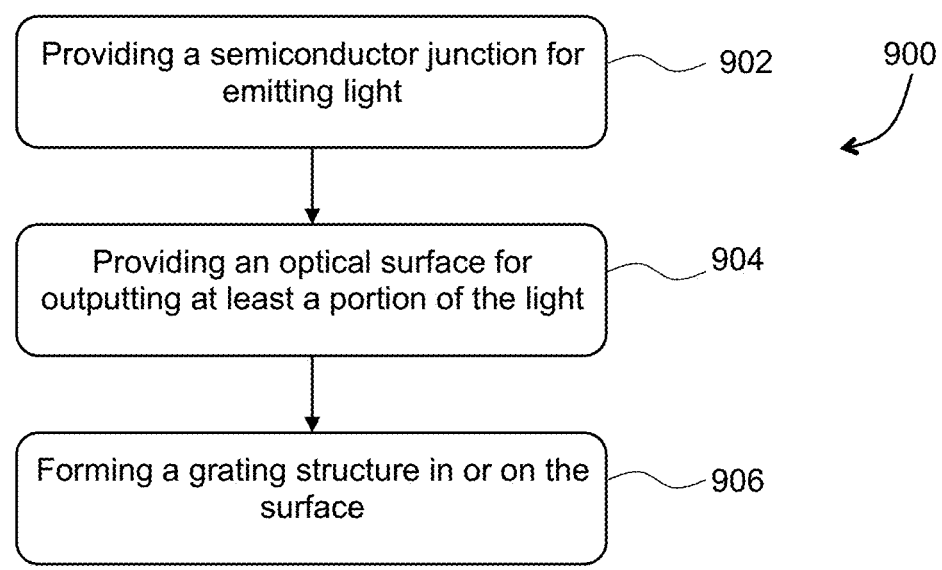
FIG. 9 is a flow chart of a method of manufacturing an LED or an LED array of the present disclosure.

Referring to FIG. 9, a method 900 for manufacturing an LED of the present disclosure includes providing (902), e.g. epitaxially growing, a semiconductor junction for emitting light. An optical surface is then provided (904), e.g. grown or formed from a semiconductor by a chemical oxidization process. In some cases, an outer surface of one semiconductor regions of the junction may be used as an optical surface coupled to the semiconductor junction. Then, a grating structure may be formed (906) on that surface or in that surface, e.g. lithographically by depositing photoresist and etching, by nanoimprint lithography, etc. Alternatively or in addition, a beam redirecting structure, e.g. one of the beam redirecting structures of FIGS. 7A-7D, may be formed for redirecting, reshaping, focusing, refocusing, or otherwise transforming the emitted optical beam.

Figure 10:
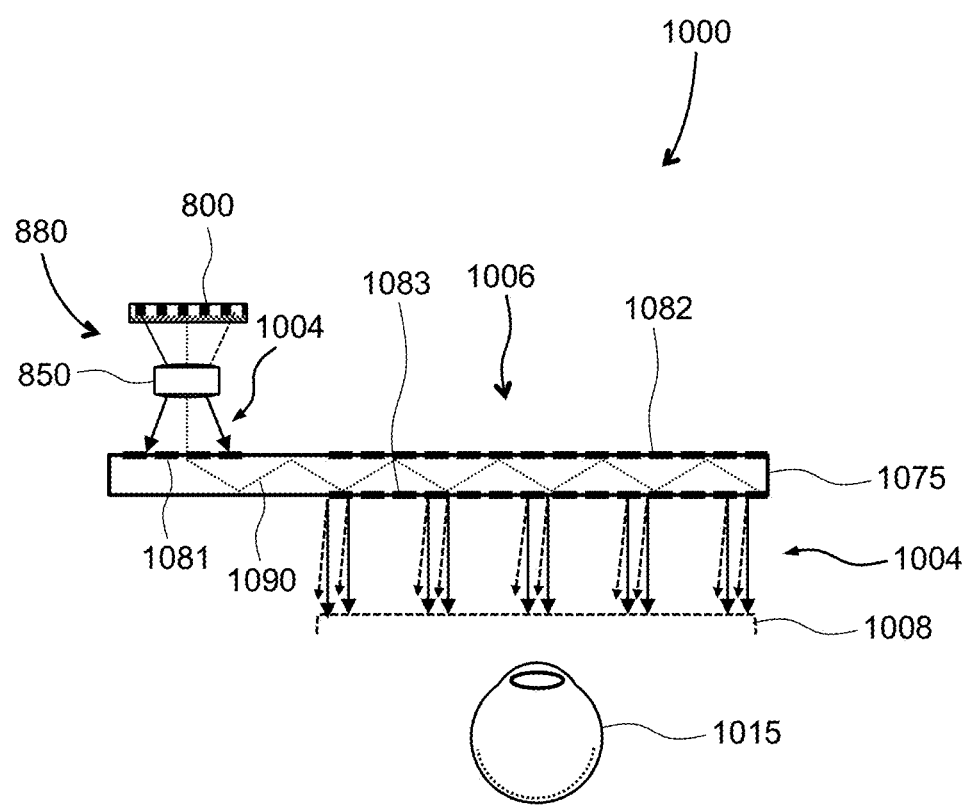
FIG. 10 is a top cross-sectional view of an optics block of a near-eye display using the image projector of FIG. 8C.

Referring now to FIG. 10, an optics block 1000 of a near-eye display may include the image projector 880 of FIG. 8C optically coupled to a waveguide 1006. The image projector 880 (FIG. 10) collimates, or nearly collimates, light emitted by each LED of the LED array 800, such that an optical beam 1004 emitted by the image projector 880 carries an image displayed by the LED array 800 in angular domain. Herein, the term "image in angular domain" means that each ray angle of a ray of the optical beam 1004 corresponds to an LED coordinate of the LED array 800.

The waveguide 1006 may include a slab 1075 of transparent material, e.g. glass or a metal oxide, supporting first 1081 and second 1082 diffraction gratings at a first side of the slab 1075, i.e. the upper side in FIG. 10. The waveguide 1006 may further include a third diffraction grating 1083 supported by the slab 1075 at a second, opposed side of the slab 1075 and disposed opposite the second diffraction grating 1082. In operation, the optical beam 1004 emitted by the image projector 880 propagates in the slab 1075 in a zigzag optical path 1090 via total internal reflections (TIR) inside the slab 1075 and diffraction on the second 1082 and third 1083 diffraction gratings. The zigzag optical path 1090 extends between the first 1081 and third 1083 diffraction gratings and includes the second diffraction grating 1082. The optical beam 1004 exits at the third diffraction grating 1083 and propagates towards a user's eye 1015 disposed at an eyebox 1008.

Figure 11A:
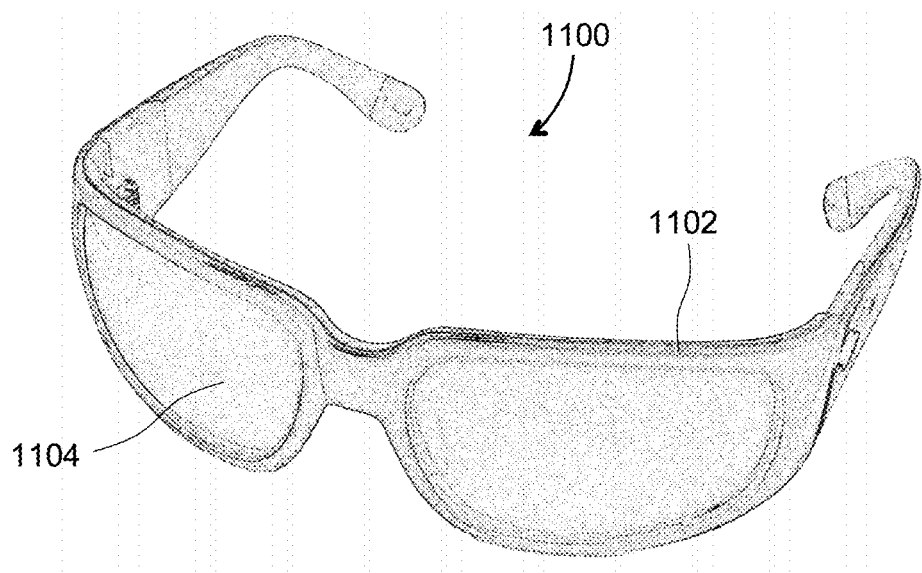
FIG. 11A is an isometric view of an eyeglasses form factor near-eye AR/VR display incorporating the optics block of FIG. 10.
Figure 11B:
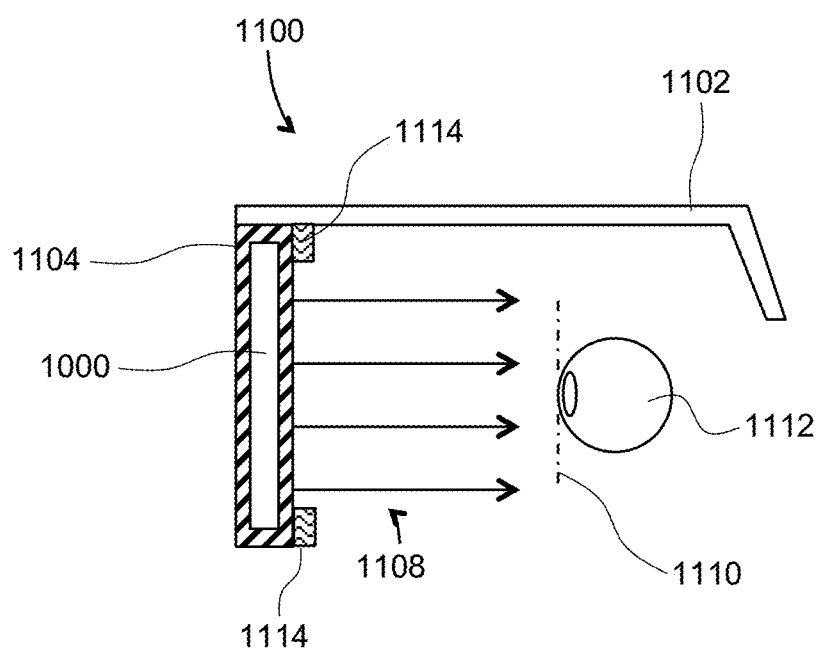
FIG. 11B is a side cross-sectional view of the display of FIG. 11A.

Turning to FIGS. 11A and 11B, a near-eye AR/VR display 1100 is a wearable display system having a frame 1102 in form of a pair of eyeglasses. A display device 1104 may include the optics block 1000 of FIG. 10 providing image light 1108 to an eyebox 1110, i.e. a three-dimensional geometrical area where a good-quality image may be presented to a user's eye 1112. The near-eye AR/VR display 1100 may also include an eye-tracking system 1114 for determining, in real time, the gaze direction and/or the vergence angle of the user's eyes 1112. The determined gaze direction and vergence angle may be used for real-time compensation of visual artifacts dependent on the angle of view and eye position. Furthermore, the determined vergence and gaze angles may be used for interaction with the user, highlighting objects, bringing objects to the foreground, dynamically creating additional objects or pointers, etc. The near-eye AR/VR display 1100 may further include an audio system, such as small speakers or headphones.

Figure 12:
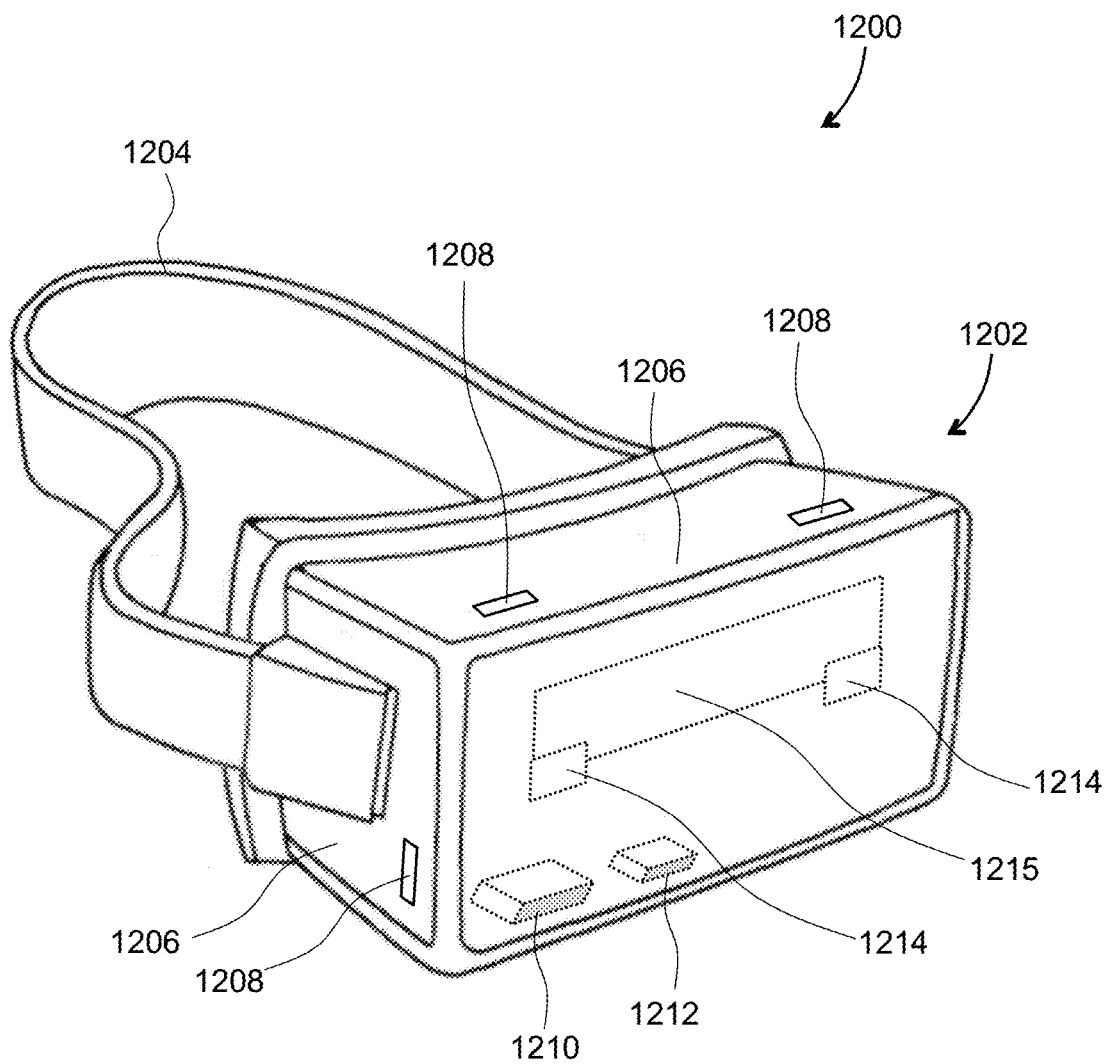
FIG. 12 is an isometric view of a head-mounted display (HMD) incorporating an LED array of the present disclosure.

Turning to FIG. 12, a head-mounted display (HMD) 1200 is a wearable display system which completely encloses user's eyes. The HMD 1200 may include any of the LEDs or LED arrays described above, as a source of generated virtual images. The HMD 1200 may provide content to a user as a part of an artificial reality system. The HMD 1200 may augment views of a physical, real-world environment with computer-generated imagery and/or to generate an entirely virtual 3D imagery. The HMD 1200 may include a front body 1202 and a head band 1204. The front body 1202 is configured for placement in front of eyes of a user, and the head band 1204 may be stretched to secure the front body 1202 on the user's head. A display module 1215 may be disposed in the front body 1202 for presenting virtual images to the user. The display module 1215 may include the optics block 1000 of FIG. 10 including any LED array described herein. Sides 1206 of the front body 1202 may be opaque or transparent.

In some embodiments, the front body 1202 includes locators 1208, an inertial measurement unit (IMU) 1210 for tracking acceleration of the HMD 1200, and position sensors 1212 for tracking position of the HMD 1200. The locators 1428 are traced by an external imaging device of a virtual reality system, such that the virtual reality system can track the location and orientation of the entire HMD 1200. Information generated by the IMU and the position sensors 1212 may be compared with the position and orientation obtained by tracking the locators 1208, for improved tracking of position and orientation of the HMD. Accurate position and orientation is important for presenting appropriate virtual scenery to the user as the latter moves and turns in 3D space.

The HMD 1200 may further include an eye tracking system 1214, which determines orientation and position of user's eyes in real time. The obtained position and orientation of the eyes allows the HMD 1200 to determine the gaze direction of the user and to adjust the image generated by the display module 1215 accordingly. In one embodiment, the vergence, that is, the convergence angle of the individual gaze directions of user's eyes, is determined. The optical power of the lenses may then be adjusted depending on the vergence to reduce or lessen the vergence-accommodation conflict. The determined gaze direction and vergence angle may also be used for real-time compensation of visual artifacts, as well as for interaction with the user, highlighting objects, bringing objects to the foreground, dynamically creating additional objects or pointers, etc. The HMD 1200 may also include an audio system, such as small speakers or headphones.

It is further noted that the near-eye AR/VR display 1100 of FIGS. 11A and 11B and the HMD 1200 of FIG. 12 are non-limiting examples of wearable display systems, in which the LEDs, LED arrays, and optics blocks and display modules of the present disclosure can be used. The light-extracting structures of the LEDs may not only increase the LED light generation efficiency, but also improve utilization of the image light generated by the LEDs in an optical display system by configuring the light-extracting structures to re direct chief rays of the generated light beams to better fill the clear aperture of the light-collecting optics such as, for example, projector lenses, waveguide coupling grating structures, light gathering prisms, etc. This may enable a further reduction of energy consumption, size, weight, and cost of wearable display systems.

The present disclosure is not to be limited in scope by the specific embodiments described herein. Indeed, other various embodiments and modifications, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A light-emitting diode (LED) comprising:
   a semiconductor junction for emitting light upon application of electric current, the semiconductor junction comprising positive (p) and negative (n) regions; and
   an optical surface coupled to the semiconductor junction and supported by one of the p- or n-regions for outputting at least a portion of the light emitted by the semiconductor junction, the optical surface comprising a redirecting structure comprising at least one of:
   a plurality of features extending from the optical surface, or
   a plurality of voids extending into the optical surface;
   wherein the plurality of features or voids of the redirecting structure extend from the optical surface non-parallel to one another to focus the light outputted by the optical surface at a distance therefrom; and
   wherein the redirecting structure is configured to redirect a chief ray of the portion of the light outputted by the optical surface from an initial direction to a predetermined different direction.

2. The LED of claim 1, wherein the optical surface is a top surface of the one of the p- or n-regions.

3. The LED of claim 1 further comprising a dielectric layer on top of the one of the p- or n-regions, wherein the optical surface is a top surface of the dielectric layer.

4. The LED of claim 1, wherein the redirecting structure comprises at least one of: a grating structure, a prism, an off-center microlens, or a layer comprising a refractive index gradient.

5. The LED of claim 1, wherein the redirecting structure comprises a layer having the plurality of voids therein, the voids having a laterally varying density for providing the refractive index gradient.

6. The LED of claim 1, wherein the redirecting structure comprises a metamaterial grating structure.

7. The LED of claim 1, wherein the plurality of features or voids comprises at least one of: rectangular features or voids; annular features or voids; cross-shaped features or voids; or chevron-shaped features or voids, respectively.

8. The LED of claim 1, wherein the plurality of features or voids comprises slanted features or voids, respectively, extending at an acute angle from the optical surface.

9. The LED of claim 1, wherein a size of the semiconductor junction is no greater than 6 microns by 6 microns.

10. A light-emitting diode (LED) array comprising:
a substrate;
an array of semiconductor junctions supported by the substrate and configured to emit light upon application of electric current; and
an array of optical surfaces each coupled to a particular one of the array of semiconductor junctions for outputting at least a portion of the light emitted thereby, wherein each optical surface of the array of optical surfaces comprises a redirecting structure configured to redirect a chief ray of the portion of the light outputted by the optical surface from an initial direction towards a center of the LED array;
wherein the semiconductor junctions each comprise positive (p) and negative (n) regions, wherein each optical surface of the array of optical surfaces is supported by one of the p- or n-regions of a corresponding semiconductor junction; and
wherein the redirecting structure comprises at least one of: a plurality of features extending from the optical surface, or a plurality of voids extending into the optical surface; wherein the plurality of features of voids of the redirecting structure extend from the optical surface non-parallel to one another to focus the light outputted by the optical surface at a distance therefrom.

11. The LED array of claim 10, wherein each optical surface of the array of optical surfaces is a top surface of the corresponding one of the p- or n-regions.

12. The LED array of claim 10 further comprising a dielectric layer on top of each one of the p- or n-regions, wherein each optical surface is a top surface of the corresponding dielectric layer.

13. The LED array of claim 10, wherein the redirecting structure is configured to provide a pre-defined divergence of the portion of the light outputted by the optical surface.

14. The LED array of claim 10, wherein the redirecting structure comprises at least one of: a grating structure, a prism, an off-center microlens, a layer comprising a refractive index gradient, or a layer having a plurality of openings therein, the openings having a laterally varying density.

15. The LED array of claim 14, wherein the redirecting structure comprises the grating structure, and wherein the grating structure comprises at least one of: an array of features extending from the optical surface; or an array of voids extending into the optical surface.

16. The LED array of claim 15, wherein the array of features or voids comprises slanted features or voids, respectively, extending at an acute angle from the optical surface.

17. The LED array of claim 16, wherein the slanted features or voids are inclined towards a center of the LED array.

18. A method of manufacturing a light-emitting diode (LED), the
method comprising:
providing a semiconductor junction for emitting light, the semiconductor junction comprising positive (p) and negative (n) regions;
providing an optical surface supported by one of the p- or n-regions for outputting at least a portion of the light, wherein the optical surface is coupled to the semiconductor junction; and
forming, in the optical surface or on the optical surface, a redirecting structure comprising at least one of:
a plurality of features extending from the optical surface, or
a plurality of voids extending into the optical surface;
wherein the plurality of features or voids of the redirecting structure extend from the optical surface non-parallel to one another to focus the light outputting by the optical surface at a distance therefrom; and
wherein the redirecting structure is configured to redirect a chief ray of the portion of the light outputted by the optical surface from an initial direction to a predetermined different direction.

* * * * *